United States Patent
Kim et al.

(10) Patent No.: US 10,256,800 B1
(45) Date of Patent: Apr. 9, 2019

(54) DELAY-LOCKED LOOP CIRCUIT AND SELECTION METHOD OF UNIT COARSE DELAY THEREOF

(71) Applicant: Winbond Electronics Corp., Taichung (TW)

(72) Inventors: Joonho Kim, Taichung (TW); Chi-Hsiang Sun, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/005,706

(22) Filed: Jun. 12, 2018

(51) Int. Cl.
*H03K 5/14* (2014.01)
*H03L 7/081* (2006.01)
*H03K 5/00* (2006.01)

(52) U.S. Cl.
CPC ............. *H03K 5/14* (2013.01); *H03L 7/0812* (2013.01); *H03K 2005/00019* (2013.01)

(58) Field of Classification Search
CPC . H03K 5/14; H03K 2005/00019; H03L 7/812
USPC ....... 327/158, 159, 149, 150, 153, 161, 250, 327/261–290
See application file for complete search history.

(56) References Cited

U.S. PATENT DOCUMENTS 5,686,850 A * 11/1997 Takaki ................... H03K 5/131
327/231
9,584,107 B2   2/2017 Huang et al.

FOREIGN PATENT DOCUMENTS

CN   106253883   12/2016
TW   201030726   8/2010

* cited by examiner

*Primary Examiner* — Thomas Skibinski
(74) *Attorney, Agent, or Firm* — JCIPRNET

(57) ABSTRACT

A delay-locked loop circuit and a selection method of unit coarse delay are provided. The delay-locked loop circuit includes a frequency detector and a unit coarse delay selector. The frequency detector receives a reset signal and a clock signal. The frequency detector performs a sampling operation to detect a clock frequency of the clock signal based on a time shift of the reset signal and a sequential delay of the reset signal to generate a plurality of determining signals. The unit coarse delay selector selects one of the plurality of determining signals with an earliest transition time as a selected coarse delay signal to control a timing of the delay-locked loop circuit.

12 Claims, 6 Drawing Sheets

DELAY-LOCKED LOOP CIRCUIT AND SELECTION METHOD OF UNIT COARSE DELAY THEREOF

BACKGROUND

Technical Field

The invention is relating to a memory storage device, and more specifically, to a delay-locked loop (DLL) circuit of dynamic random access memory (DRAM) and a selection method of unit coarse delay thereof.

Description of Related Art

A delay-locked loop (DLL) circuit is widely used in dynamic random access memory (DRAM) to compensate for a time delay occurring due to the external clock signal reaching the internal circuit by passing a lot of components and circuits. It leads to internal clock signal with the same phase as the external clock signal.

In general, there are two kinds of delays in DLL. One is so called a fine delay which is smaller and is used to determine resolution of DLL. The other is so called a coarse delay which is bigger and is used to control DLL locking time. The fine delay can include a number of unit fine delays and the coarse delay can include a number of unit coarse delays.

The unit coarse delay is divided to make the unit fine delay. The unit coarse delay implies that smaller unit coarse delay is required for good DLL resolution. However, it takes longer time to complete DLL locking procedure with smaller unit coarse delay. Therefore, there is a conflict between DLL resolution and locking time with a fixed unit coarse delay. This problem can be resolved by taking different coarse unit delays depending on the clock frequency. For example, smaller unit coarse delay can be used for high frequency operation and bigger unit coarse delay can be used for low frequency operation.

In order to select different unit coarse delays depending on the input clock frequency automatically, a frequency detection circuit should be implemented. By this way, a variation of unit coarse delay along with various process corners should be also responded when the input clock frequency is detected, or there still exists a variation on DLL locking time and resolution on the same frequency since the unit coarse delay of fastest process corner can be just half of that of slowest process corner.

SUMMARY

Accordingly, the present disclosure is directed to a delay-locked loop (DLL) circuit of dynamic random access memory (DRAM) and a selection method of unit coarse delay thereof, in which a frequency detector and a unit coarse delay selector are implemented with a selection method of unit coarse delay so as to get a stable and uniform coarse delay to reduce resolution degradation caused by PVT (process, voltage and temperature) variation.

In one of the exemplary embodiments, the present disclosure is directed to a delay-locked loop circuit which would include, but not limited to, a frequency detector and a unit coarse delay selector. The frequency detector receives a reset signal and a clock signal. The unit coarse delay selector is coupled to the frequency detector. The frequency detector performs a sampling operation to detect a clock frequency of the clock signal based on a time shift of the reset signal and a sequential delay of the reset signal to generate a plurality of determining signals. The unit coarse delay selector selects one of the plurality of determining signals with an earliest transition time as a selected coarse delay signal to control a timing of the delay-locked loop circuit.

In one of the exemplary embodiments, the present disclosure is directed to a selection method of unit coarse delay, which is applicable to a delay-locked loop circuit including a frequency detector and a unit coarse delay selector. The selection method of unit coarse delay would include not limited to: receiving a reset signal and a clock signal by the frequency detector; performing a sampling operation by the frequency detector to detect a clock frequency of the clock signal based on a time shift of the reset signal and a sequential delay of the reset signal to generate a plurality of determining signals; and using the unit coarse delay selector to select one of the plurality of determining signals with an earliest transition time as a selected coarse delay signal to control a timing of the delay-locked loop circuit.

It should be understood, however, that this summary may not contain all of the aspect and embodiments of the present disclosure and is therefore not meant to be limiting or restrictive in any manner. Moreover, the present disclosure would include improvements and modifications. To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
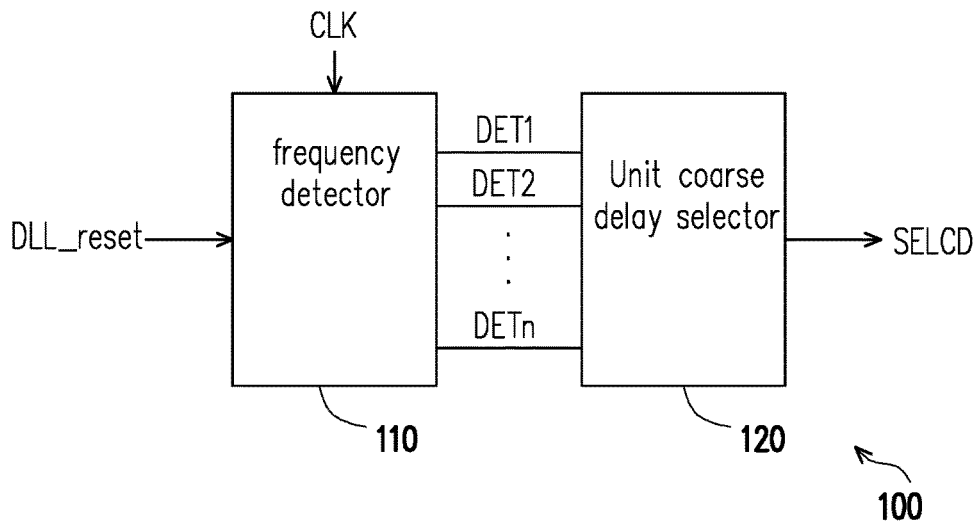
FIG. 1 is a schematic block diagram illustrating a delay-locked loop circuit according to an embodiment of the invention.

A term "couple" used in the full text of the disclosure (including the claims) refers to any direct and indirect connections. For instance, if a first device is described to be coupled to a second device, it is interpreted as that the first device is directly coupled to the second device, or the first device is indirectly coupled to the second device through other devices or connection means. Moreover, wherever possible, components/members/steps using the same referral numerals in the drawings and description refer to the same or like parts. Components/members/steps using the same referral numerals or using the same terms in different embodiments may cross-refer related descriptions.

FIG. 1 is a schematic block diagram illustrating a delay-locked loop circuit according to an embodiment of the invention. The delay-locked loop circuit 100 includes a frequency detector 110 and a unit coarse delay selector 120, but not limited thereto. In some embodiments, the delay-locked loop circuit can further include some other circuits, for example, an input receiver, a phase detector, a replica circuit, an output driver, and so on.

The frequency detector 110 receives a clock signal CLK and a reset signal DLL_reset. The clock signal CLK from an external circuit (not drawn) performs in the role of a timer especially in synchronous digital circuits. Whenever the delay-locked loop circuit 100 needs to lock the phase of clock signal CLK by matching the clock signal CLK with reference clock signal CLKREF (not drawn), the DLL reset signal DLL_reset from the external circuit is generated to reset the delay-locked loop circuit 100. Then, the frequency detector 110 performs a sampling operation to detect a clock frequency of the clock signal CLK based on a time shift of the reset signal DLL_reset and a sequential delay of the reset signal DLL_reset to generate a plurality of determining signals DET1-DETn.

Figure 5:
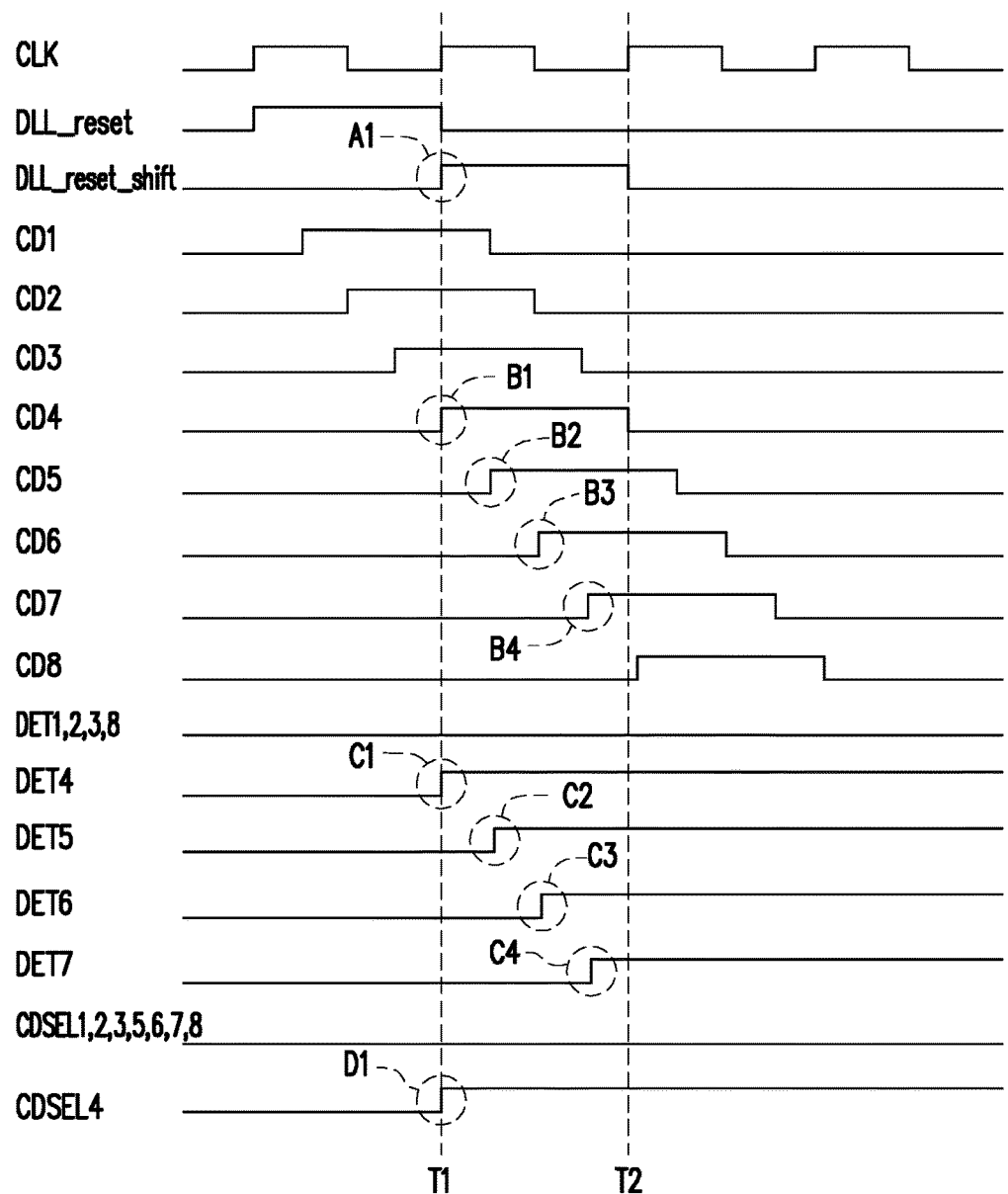
FIG. 5 is a detailed operation to a case of faster process corner in accordance with one of the exemplary embodiments of the disclosure.

Referring to FIG. 5, FIG. 5 is a detailed operation to a case of faster process corner in accordance with one of the exemplary embodiments of the disclosure. The frequency detector 110 can detect the clock frequency of the clock signal CLK by shifting the reset signal DLL_reset based on the clock signal CLK (as DLL_reset_shift), delaying the reset signal DLL_reset in sequence (as coarse delay signals CD1-CD8), and performing a sampling operation based on above to generate the determining signal DET1-DET8. It is noted that the sampling operation will be explained later. Moreover, the determining signal DET4-DET7 with transitions and determining signals DET1-DET3, DET8-DETn without transitions are provided for the unit coarse delay selector 120 to determine how many unit coarse delays are required for maintaining a uniform coarse delay to lock the phase of the clock signal CLK stably. As a result, the frequency detector 110 is able to detect a clock frequency of the clock signal CLK base on above. In addition, the unit coarse delay is defined as the unit of sequential delay in the step of delaying the reset signal DLL_reset in sequence (as coarse delay signals CD1-CD8), such as the difference between coarse delay signals CD1 and CD2 (for example, 1 nanosecond in faster process corner).

The unit coarse delay selector 120 is coupled to a frequency detector 110, and receives the plurality of determining signals DET1-DETn from the frequency detector 110. The unit coarse delay selector 120 selects one of the determining signals DET1-DETn with an earliest transition time as a selected coarse delay signal SELCD to control a timing of the delay-locked loop circuit.

Referring to FIG. 5, the unit coarse delay selector 120 selects the selected coarse delay signal SELCD from the determining signals DET1-DET8. For example, at first the unit coarse delay selector 120 determines coarse delay selecting signals CDSEL1-CDSEL8 according to the determining signals DET1-DET8. In an embodiment, the determining signals DET4 with an earliest transition time is a target and a corresponding coarse delay selecting signal CDSEL4 follows the logic state of determining signal DET4. That is to say, the unit coarse delay selector 120 selects CDSEL4 as the selected coarse delay signal SELCD. It means the clock signal CLK needs 4 unit coarse delays for phase locking. The detail will be described later.

It is noted, in some embodiments, the selected coarse delay signal SELCD indicates a number of unit coarse delays required for a coarse delay operation to lock a phase of the clock signal. The coarse delay operation represents that the delay-locked loop circuit 100 lock the phase of the clock signal CLK through a certain number of unit coarse delays.

Figure 2:
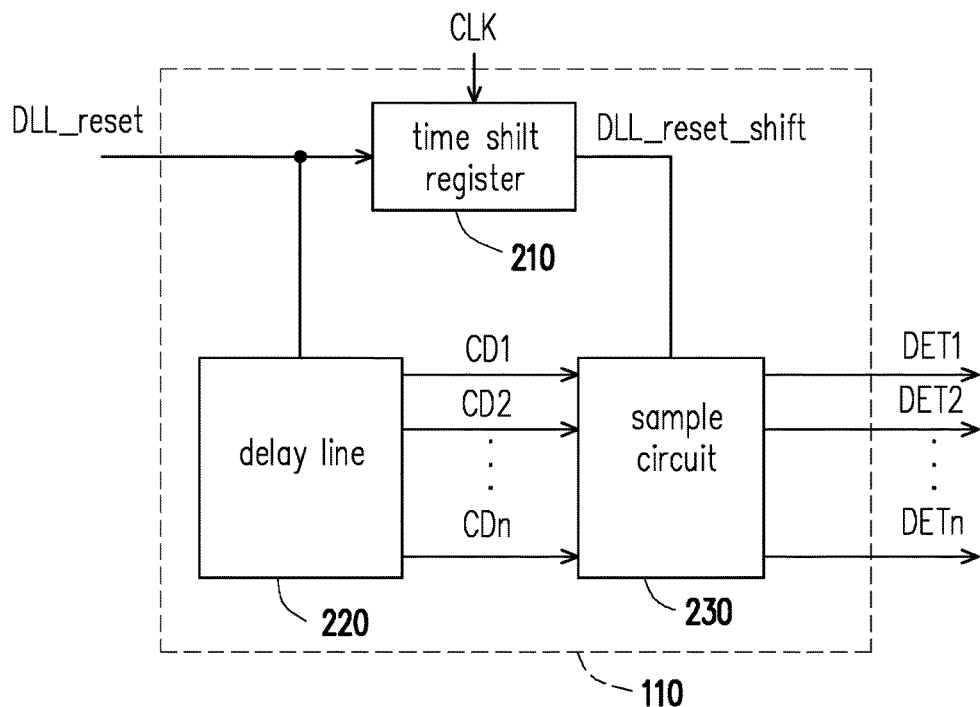
FIG. 2 is a schematic block diagram illustrating a frequency detector according to an embodiment of the invention.

FIG. 2 is a schematic block diagram illustrating a frequency detector according to an embodiment of the invention. In an embodiment, the frequency detector 110 includes a time shift register 210, a delay line 220, and a sample circuit 230.

The time shift register 210 receives the reset signal DLL_reset and the clock signal CLK to perform the time shift of the reset signal DLL_reset for shifting a timing of the reset signal DLL_reset based on the clock signal CLK to generate a shifted reset signal DLL_reset_shift. In an embodiment, the time shift register 210 can be a cascade of flip flops used to shift the timing DLL_reset by delaying the DLL_reset, so as to generate the shifted reset signal DLL_reset_shift. The present invention does not limit to the type of the time shift register 210.

The delay line 220 is coupled to the time shift register 210 and receives the reset signal DLL_reset to perform the sequential delay of the reset signal DLL_reset for delaying the reset signal DLL_reset in sequence to generate the plurality of coarse delay signals CD1-CDn. In an embodiment, the delay line 220 can be a cascade of delay cells for delaying the reset signal DLL_reset in sequence, so as to generate the coarse delay signals CD1-CDn.

The sample circuit 230 is coupled to the delay line 220 and the time shift register 210, receiving the shifted reset signal DLL_reset_shift and the coarse delay signals CD1-CDn, to perform the sampling operation for sampling the shifted reset signal DLL_reset_shift based on the same edges of the coarse delay signals CD1-CDn to generate the determining signals DET1-DETn. The sampling operation, for example, can be explained as FIG. 5 in which the sample circuit 230 can sample the shifted reset signal DLL_reset_shift by rising edges of coarse delay signals CD1-CDn so as to generate determining signals DET4-DET7 with transitions and determining signals DET1-DET3, DET8-DETn without transitions. The present invention does not limit to the method of the sample operation.

Figure 3:
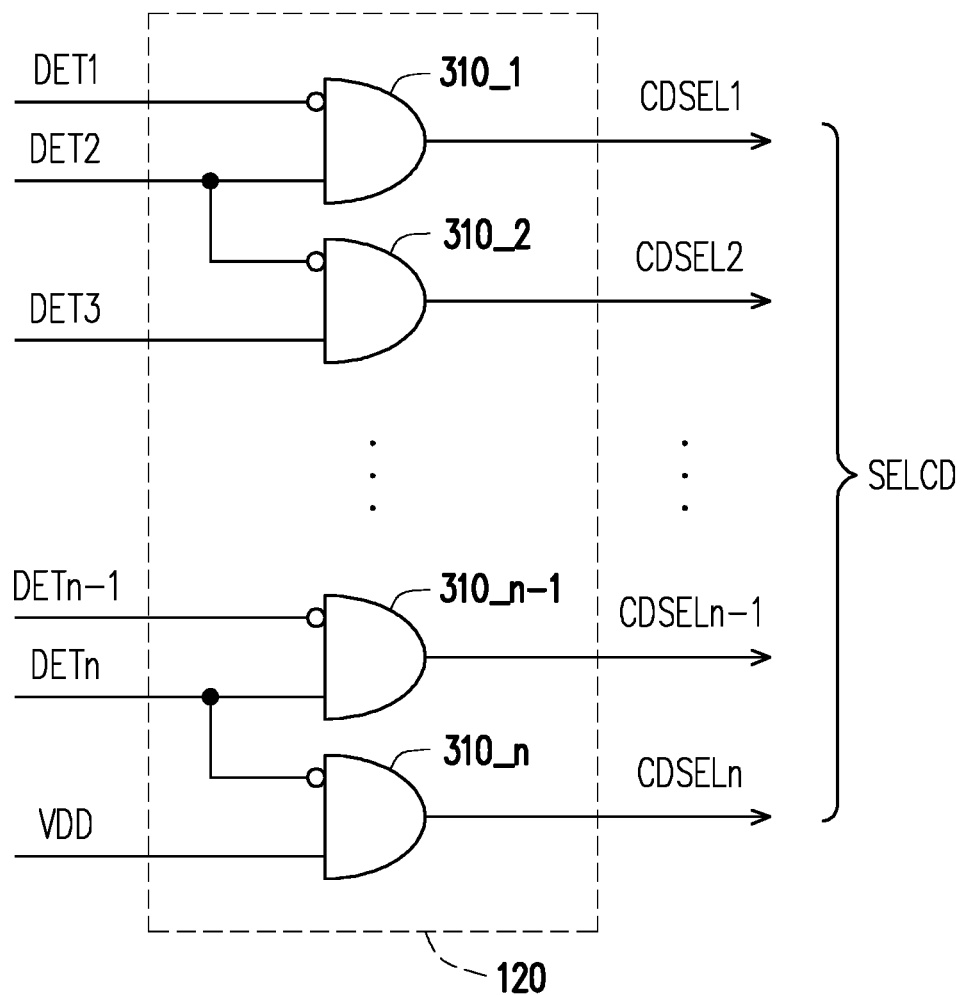
FIG. 3 is a schematic block diagram illustrating a unit coarse delay selector according to an embodiment of the invention.

FIG. 3 is a schematic block diagram illustrating a unit coarse delay selector according to an embodiment of the invention. The unit coarse delay selector 120 includes a plurality of logic gates 310_1-310_n. Each of the logic gates 310_1-310_n receives two adjacent determining signals of the determining signals DET1-DETn to generate a corresponding one of a coarse delay selecting signals CDSEL1-CDSELn. Afterwards, the unit coarse delay selector 120 selects one of the determining signals DET1-DETn with an earliest transition time as a selected coarse delay signal SELCD according to the plurality of coarse delay selecting signals CDSEL1-CDSELn.

Referring FIG. 3 and FIG. 5, in an embodiment, the logic gates 310_1-310_n can be AND gates. For example, the logic gate 310_1 receives an inverse determining signal DET1 and the determining signal DET2 to generate a coarse delay selecting signal CDSEL1. The logic gate 310_2 receives an inverse determining signal DET2 and the determining signal DET3 to generate a coarse delay selecting signal CDSEL2. And the logic gate 310_n receives an inverse determining signal DETn-1 and the determining signal DETn to generate a coarse delay selecting signal CDSELn. In FIG. 5, a coarse delay selecting signal CDSEL4 is selected as a selected coarse delay signal SELCD due to the logic gate 310_4 receiving the determining signal DET3 without transitions and the determining signal DET4 with the earliest transition among the determining signals DET1-DET8. As a result, it represents that 4 unit coarse delays are required for maintaining a uniform coarse delay to lock the phase of clock signal CLK in this case.

Figure 4:
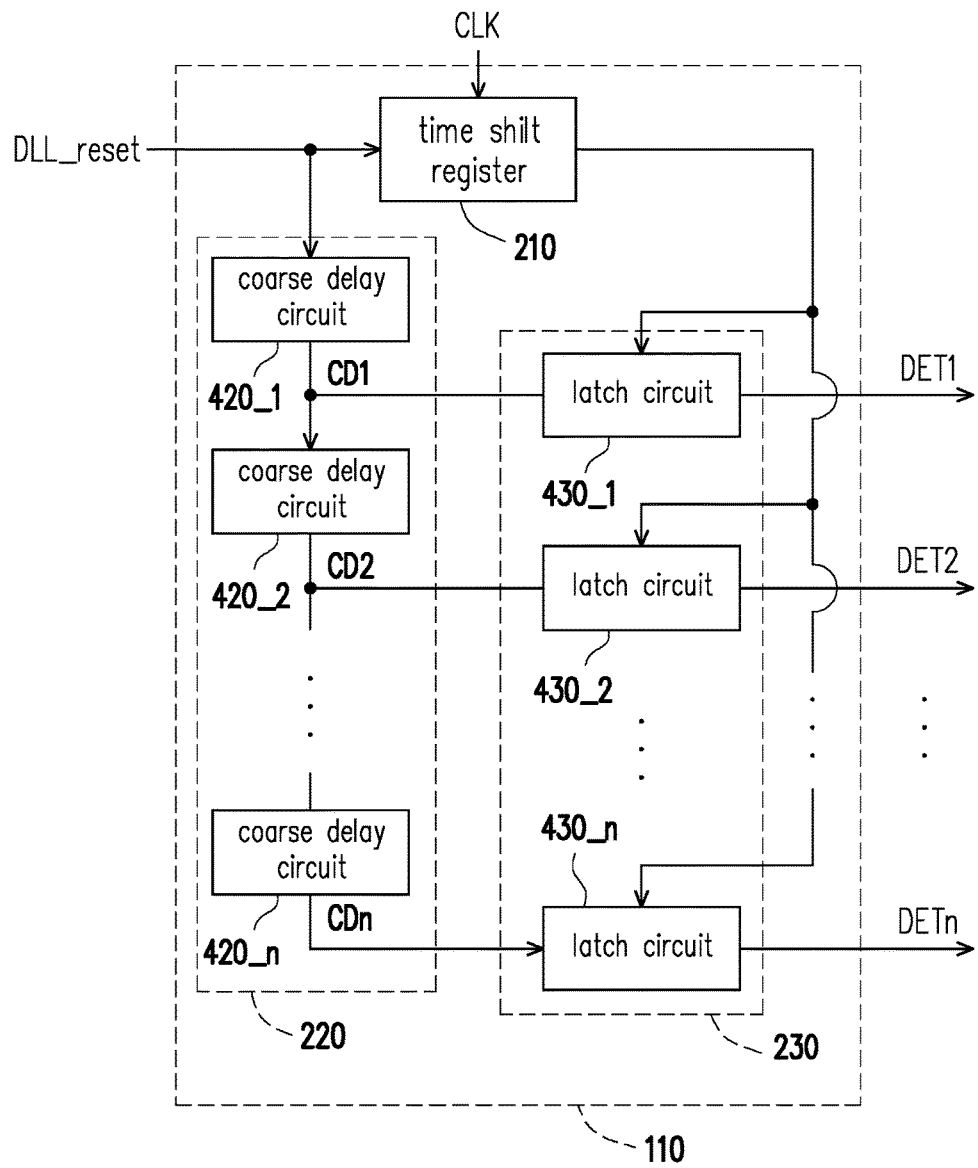
FIG. 4 is a schematic block diagram illustrating a time shift register, a delay line, and a sample circuit according to an embodiment of the invention.

FIG. 4 is a schematic block diagram illustrating a time shift register, a delay line, and a sample circuit according to an embodiment of the invention. Regarding the time register 210, it has been described in FIG. 2 and is not needed to repeat.

The delay line 220 includes a plurality of coarse delay circuits 420_1-420_n being cascaded in sequence and generate the coarse delay signals. For example, the coarse delay circuit 420_1 receives and delays the reset signal DLL_reset to generate coarse delay signal CD1. The coarse delay circuit 420_2 receives and delays the coarse delay signal CD1 to generate the coarse delay signal CD2. And the coarse delay circuit 420_n receives and delays the coarse delay signal CDn-1 to generate the coarse delay signal CDn. In an embodiment, each of the coarse delay circuit CD1-CDn can be implemented by one or more inverters. The present invention does not limit the type of delay circuit. Noted that the coarse delay circuits 420_1-420_n can be connected in series and in the order of numbers, as shown in FIG. 4.

The sample circuit 230 includes a plurality of latch circuits 430_1-430_n, and each of the latch circuits 430_1-430_n respectively generates a corresponding determining signal of determining signals DET1-DETn in response to determining whether a rising edge of a corresponding coarse delay signal of the coarse delay signals CD1-CDn falls within a pulse period of the shifted reset signal DLL_reset_shift.

According to an embodiment of the present invention, the latch circuits 430_1-430_n receive the coarse delay signals CD1-CDn and the shifted reset signal DLL_reset_shift from the coarse delay circuits 420_1-420_n and time shift register 210. In an embodiment, the latch circuits 430_1-430_n can be flip flips. The invention does not limit the type of the latch circuits 430_1-430_n. The latch circuits 430_1-430_n latch the shifted reset signal DLL_reset_shift based on the rising edges of the coarse delay signals CD1-CDn to generate the determining signals DET1-DETn. For example, referring to FIG. 5, the latch circuit 430_1 receives the coarse delay signal CD1 and the reset signal DLL_reset_shift, and determines whether the rising edge of the coarse delay signal CD1 falls within the pulse period of the shifted reset signal DLL_reset_shift. Apparently, the rising edge of the coarse delay signal CD1 does not fall within the pulse period of the shifted reset signal DLL_reset_shift in this case. As such, the determining signal DET1 without transitions is generated by the latch circuit 430_1. For the same reason, there are also no transitions in the determining signals DET2-3 and DET8-n. On the other hand, the rising edges of the coarse delay signals CD4-CD7 actually fall within the pulse period of the shifted reset signal DLL_reset_shift, resulting in the determining signals DET4-DET7 with transitions from logic low to logic high.

It is noted that the unit coarse delay is affected by PVT variation, and the invention provides a uniform coarse delay for locking the phase of the clock signal CLK by taking a different number of unit coarse delays depending on PVT variation. Besides, in some embodiments, the clock signal CLK and the reset signal DLL_reset from the external circuit (not drawn) are free from PVT variation in the delay-locked loop circuit 100. And the shifted reset signal DLL_reset_shift which is shifted by the time shift register 210 based on clock signal CLK is slightly affected by PVT variation.

In FIG. 5, a process variation causes a faster process corner so that a unit coarse delay on the faster process corner is shortened and becomes a smaller unit coarse delay (for example, 1 ns on the faster process corner). As such, the delay-locked loop circuit 100 apparently requires more unit coarse delays to keep a uniform coarse delay (for example, 4 ns). By means of the time shift register 210, the reset signal DLL_reset is shifted to the shifted reset signal DLL_reset_shift for one cycle of the clock signal CLK, wherein a rising edge A1 of the shifted reset signal DLL_reset_shift occurs on time point T1, and the falling edge of that occurs on time point T2. In addition, the coarse delay circuits 420_1-420_8 delay the reset signal DLL_reset in sequence to generate the coarse delay signals CD1-CD8. Afterwards, the latch circuits 430_1-430_8 determine whether the rising edges of the coarse delay signals CD1-CD8 fall within a pulse period of the shifted reset signal DLL_reset_shift so as to generate determining signals DET1-DET8. In this case, the coarse delay signals CD4-CD7 with rising edges B1-B4 falling within the pulse period of the shifted reset signal DLL_reset_shift can be latched by latch circuits 430_4-430_7 to generate the determining signals DET4-DET7 with rising edges C1-C4. Finally, the logic gates 310_1-310_8 of the unit coarse delay selector 120 receive the determining signals DET1-DET8 to generate the coarse delay selecting signals CDSEL1-CDSEL8. The coarse delay selecting signals CDSEL4 has a transition with a rising edge D1 falling on time point T1 because the logic gate 310_4 receives the determining signal DET3 without transitions and the determining signal DET4 with a earliest transition among the determining signals DET1-DET8. As a result, it leads to 4 unit coarse delays required for maintaining the uniform coarse delay (for example, 4 ns) to lock the phase of clock signal CLK in response to the faster process corner.

Figure 6:
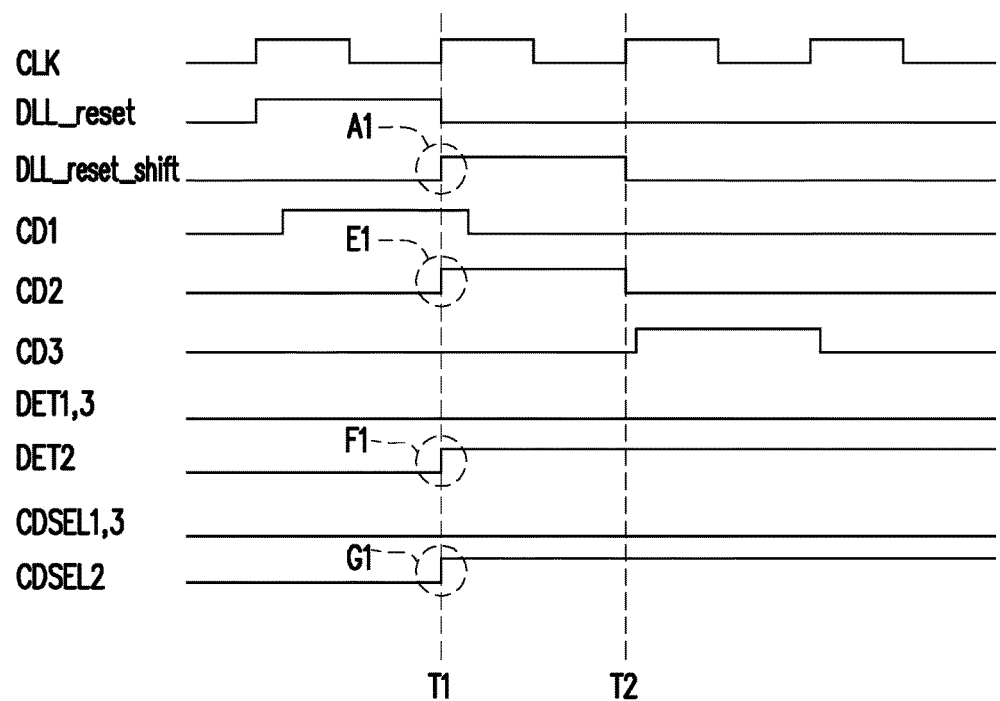
FIG. 6 is a detailed operation to a case of slower process corner in accordance with one of the exemplary embodiments of the disclosure.

FIG. 6 is another process variation causing a slower process corner so that a unit coarse delay on the slower process corner is lengthened and becomes a larger unit coarse delay (for example, 4 ns on the slower process corner). As such, the delay-locked loop circuit 100 apparently requires less unit coarse delays to keep a uniform coarse delay (for example, 4 ns). However, FIG. 6 is similar to FIG. 5, and some parts are no need to repeat again. Compared to FIG. 5, FIG. 6 includes only three coarse delays signals CD1-CD3 generated by the coarse delay circuit 420_1-420_3 on this slower process corner due to a larger unit coarse delay, wherein only a rising edge E1 of coarse delay signal CD2 falls between the time point T1 and the time point T2. Next, the latch circuits 430_1-430_3 determine whether the rising edges of the coarse delay signals CD1-CD3 fall within a pulse period of the shifted reset signal DLL_reset_shift to generate determining signals DET1-DET3. In this slower case, the coarse delay signals CD2 can be latched and the determining signal DET2 with a rising edge F1 is generated. Finally, the logic gates 310_1-310_3 of the unit coarse delay selector 120 receive the determining signals DET1-DET3 to generate the coarse delay selecting signals CDSEL1-CDSEL3. The coarse delay selecting signals CDSEL2 has a transition with a rising edge G1 falling on time point T1 because the logic gate 310_2 receives the determining signal DET1 without transitions and the determining signal DET2 with a earliest transition among the determining signals DET1-DET3. Accordingly, it leads to only 1 unit coarse delay required for maintaining the uniform coarse delay (for example, 4 ns) to lock the phase of clock signal CLK in response to the slower process corner.

As a consequence, the invention provides a uniform coarse delay time by dynamically selecting the unit coarse delay. It can effectively reduce the resolution degradation and the locking time variation on various process corners induced by PVT variation.

Figure 7:
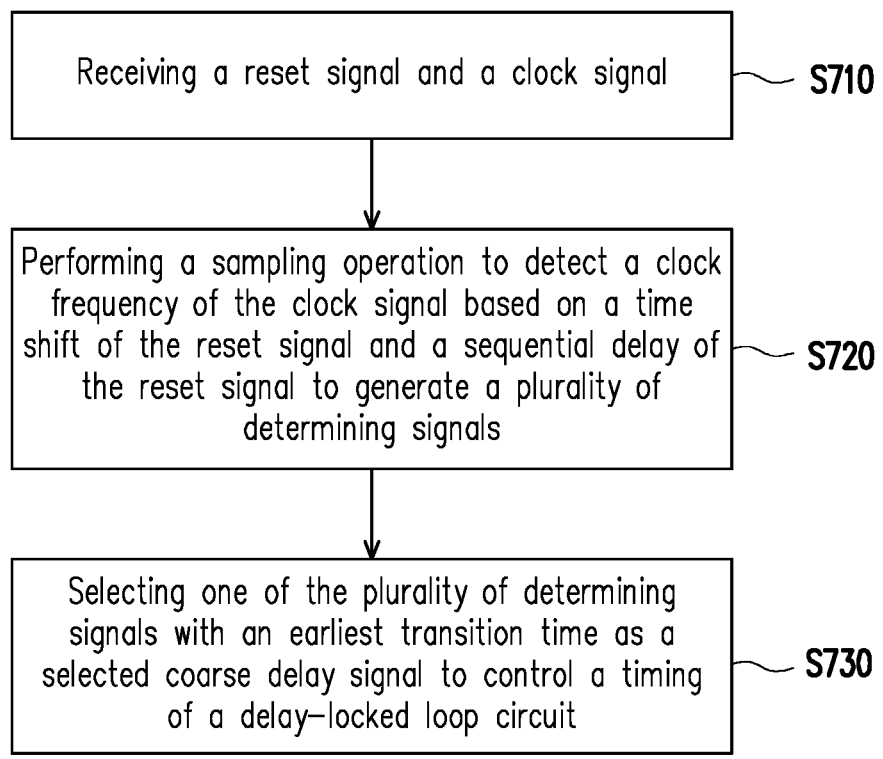
FIG. 7 is flowchart illustrating a selection method of unit coarse delay according to an embodiment of the invention.

FIG. 7 is flowchart illustrating a selection method of unit coarse delay according to an embodiment of the invention. The selection method of unit coarse delay can be performed by a delay-locked loop circuit 100 comprising a frequency detector 110 and a unit coarse delay selector 120 of the embodiment of FIG. 1. Therefore, the selection method will be illustrated by referring to the aforementioned delay-locked loop circuit 100 in the present embodiment.

In step S710, the frequency detector 110 receives a reset signal DLL_reset and a clock signal CLK. Next, in step S720, the frequency detector 110 performs a sampling operation by the frequency detector 110 to detect a clock frequency of the clock signal CLK based on a time shift of the reset signal DLL_reset and a sequential delay of the reset signal DLL_reset to generate a plurality of determining signals DET1-DETn. In step S730, the unit coarse delay selector 120 selects one of the plurality of determining signals DET1-DETn with an earliest transition time as a selected coarse delay signal SELCD to control a timing of the delay-locked loop circuit 100.

It should be noted that the invention can further reduce DLL locking time in some embodiment with longer cycle time. When the cycle time of clock signal CLK is longer, the locking time can be still similar due to a uniform coarse delay generated by the dynamic selection of unit coarse delay, so as to improve the locking time for cases with longer cycle time.

Base on above, by combining the frequency detector 110 with the unit coarse delay selector 120, the delay-locked loop circuit 100 detects the frequency of clock signal and select how many unit coarse delays required for maintaining a uniform coarse delay to lock the phase of the clock signal CLK. By adopting the selection method of unit coarse delay, the uniform coarse delay can be achieved to stabilize the DLL resolution and locking time on various process corners, and to improve locking time for cases with longer cycle time.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A delay-locked loop circuit, comprising:
   a frequency detector, receiving a reset signal and a clock signal, wherein the frequency detector is configured to perform a sampling operation to detect a clock frequency of the clock signal based on a time shift of the reset signal and a sequential delay of the reset signal to generate a plurality of determining signals; and
   a unit coarse delay selector, coupled to the frequency detector, wherein the unit coarse delay selector is configured to select one of the plurality of determining signals with an earliest transition time as a selected coarse delay signal to control a timing of the delay-locked loop circuit.

2. The delay-locked loop circuit as claimed in claim 1, wherein the frequency detector comprises:
   a time shift register, receiving the reset signal and the clock signal to perform the time shift of the reset signal for shifting a timing of the reset signal based on the clock signal to generate a shifted reset signal;
   a delay line, coupled to the time shift register, receiving the reset signal to perform the sequential delay of the reset signal for delaying the reset signal in sequence to generate the plurality of coarse delay signals; and
   a sample circuit, coupled to the delay line and the time shift register, receiving the shifted reset signal and the plurality of coarse delay signals to perform the sampling operation for sampling the shifted reset signal based on the same edges of the plurality of coarse delay signals to generate the plurality of determining signals.

3. The delay-locked loop circuit as claimed in claim 2, wherein the delay line comprises a plurality of coarse delay circuits being cascaded in sequence and generate the plurality of coarse delay signals.

4. The delay-locked loop circuit as claimed in claim 2, wherein the sample circuit comprises a plurality of latch circuits, and each of the plurality of latch circuits respectively generates a corresponding determining signal of the plurality of determining signals in response to determining whether a rising edge of a corresponding coarse delay signal of the plurality of coarse delay signals falls within a pulse period of the shifted reset signal.

5. The delay-locked loop circuit as claimed in claim 1, wherein the unit coarse delay selector comprises a plurality of logic gates which each of the plurality of logic gates receives two adjacent determining signals of the plurality of determining signals to generate a corresponding one of a plurality of coarse delay selecting signals, and the unit coarse delay selector selects one of the plurality of determining signals with an earliest transition time as a selected coarse delay signal according to the plurality of coarse delay selecting signals.

6. The delay-locked loop circuit as claimed in claim 5, wherein the selected coarse delay signal indicates a number of unit coarse delays required for a coarse delay operation to lock a phase of the clock signal.

7. A selection method of unit coarse delay, applicable to a delay-locked loop circuit comprising a frequency detector and a unit coarse delay selector, the selection method of unit coarse delay comprising:
   receiving a reset signal and a clock signal by the frequency detector;
   performing a sampling operation by the frequency detector to detect a clock frequency of the clock signal based on a time shift of the reset signal and a sequential delay of the reset signal to generate a plurality of determining signals; and
   selecting, by the unit coarse delay selector, one of the plurality of determining signals with an earliest transition time as a selected coarse delay signal to control a timing of the delay-locked loop circuit.

8. The selection method of unit coarse delay as claimed in claim 7, wherein the frequency detector comprises a timing shift register, a delay line and a sample circuit, and the step of performing a sampling operation by the frequency detector to detect a clock frequency of the clock signal based on a time shift of the reset signal and a sequential delay of the reset signal to generate a plurality of determining signals comprises:

performing the time shift of the reset signal by the timing shift register for shifting a timing of the reset signal based on the clock signal to generate a shifted reset signal;

performing the sequential delay of the reset signal by the delay line for delaying the reset signal in sequence to generate the plurality of coarse delay signals; and performing the sampling operation by the sample circuit for sampling the shifted reset signal based on the same edges of the plurality of coarse delay signals to generate the plurality of determining signals.

9. The selection method of unit coarse delay as claimed in claim 8, wherein the delay line comprises a plurality of coarse delay circuits being cascaded in sequence and generate the plurality of coarse delay signals.

10. The selection method of unit coarse delay as claimed in claim 8, wherein the sample circuit comprises a plurality of latch circuits, and each of the plurality of latch circuits respectively generates a corresponding determining signal of the plurality of determining signals in response to determining whether a rising edge of a corresponding coarse delay signal of the plurality of coarse delay signals falls within a pulse period of the shifted reset signal.

11. The selection method of unit coarse delay as claimed in claim 7, wherein the unit coarse delay selector comprises a plurality of logic gates which each of the plurality of logic gates receives two adjacent determining signals of the plurality of determining signals to generate a corresponding one of a plurality of coarse delay selecting signals, and the unit coarse delay selector selects one of the plurality of determining signals with an earliest transition time as a selected coarse delay signal according to the plurality of coarse delay selecting signals.

12. The selection method of unit coarse delay as claimed in claim 11, wherein the selected coarse delay signal indicates a number of unit coarse delays required for a coarse delay operation to lock a phase of the clock signal.

* * * * *